(12) United States Patent
Eitrheim et al.

(10) Patent No.: US 6,788,585 B1
(45) Date of Patent: Sep. 7, 2004

(54) SYSTEM AND METHOD FOR PROCESSING DATA IN A MEMORY ARRAY

(75) Inventors: John K. Eitrheim, Plano, TX (US); Jeffrey A. Huxel, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 22 days.

(21) Appl. No.: 10/306,281

(22) Filed: Nov. 27, 2002

(51) Int. Cl.[7] .............................................. G11C 16/04
(52) U.S. Cl. ............................. 365/189.04; 365/189.01
(58) Field of Search ....................... 365/189.04, 189.01, 365/233, 230.06, 230.08, 193

(56) References Cited

U.S. PATENT DOCUMENTS

| 5,173,878 A | * 12/1992 | Sakui et al. ........... 365/230.02 |
|---|---|---|
| 5,644,741 A | 7/1997 | Bluhm et al. ............... 395/376 |
| 5,698,995 A | 12/1997 | Usami .......................... 326/93 |
| 5,883,826 A | 3/1999 | Wendell et al. ............... 365/63 |
| 5,940,334 A | 8/1999 | Holst .......................... 365/190 |
| 6,073,203 A | * 6/2000 | Kufer et al. .................... 711/5 |
| 6,401,167 B1 | 6/2002 | Barth et al. ................. 711/106 |
| 6,512,683 B2 | * 1/2003 | Hsu et al. ..................... 365/49 |

* cited by examiner

*Primary Examiner*—Anh Phung
(74) *Attorney, Agent, or Firm*—Baker Botts L.L.P.

(57) ABSTRACT

A method for processing data is provided that includes receiving a first request in a first clock cycle from a processor for access to a first data segment corresponding to a first address included in the first request. A second request for access to a second data segment corresponding to a second address included in the second request is received during a second clock cycle. The second data segment is disabled from being communicated to the processor and the first data segment is communicated to the processor in response to the second request.

28 Claims, 2 Drawing Sheets

SYSTEM AND METHOD FOR PROCESSING DATA IN A MEMORY ARRAY

TECHNICAL FIELD OF THE INVENTION

This invention relates in general to the field of data processing and more particularly to a system and method for processing data in a memory array.

BACKGROUND OF THE INVENTION

Data processing architectures have grown increasingly complex in data communication and data processing systems. Some data processing systems may include one or more elements that are configured to provide some result or to produce a selected output based on an assigned task. A processor may be generally used to execute one or more tasks in combination with some data storage element that maintains data or information in an integrated circuit environment.

One drawback associated with some data processing architectures is that they suffer from slow processing speeds For example, in pipelined applications, a speed limiting path may be created by components or elements that experience some delay in receiving a requisite input. This may be the result of one or more elements in a system architecture that are unable to process information properly in order to produce a resultant to be communicated to a receiving element or component that relies on that information to execute its assigned task. Thus, a deficiency in one or more elements within an integrated circuit may cause additional components or elements to similarly suffer in performance or efficacy.

Components or elements that wait for some resultant value to be received before proceeding to a next step in a processing operation may inhibit system performance and contribute to inferior processing speeds. Accordingly, the ability to provide a fast and accurate data processing system that allows for resultant values to be seamlessly communicated between components without delay is a significant challenge to system designers and manufacturers of data processing architectures.

SUMMARY OF THE INVENTION

From the foregoing, it may be appreciated by those skilled in the art that a need has arisen for an improved approach for communicating information in a data processing environment. In accordance with one embodiment of the present invention, a system and method for processing data in a memory array are provided that substantially eliminate or greatly reduce disadvantages and problems associated with conventional data processing techniques.

According to one embodiment of the present invention, there is provided a method for processing data that includes receiving a first request in a first clock cycle from a processor for access to a first data segment corresponding to a first address included in the first request. The method also includes receiving a second request in a second clock cycle for access to a second data segment corresponding to a second address included in the second request. The second data segment is disabled from being communicated to the processor and the first data segment is communicated to the processor in response to the second request.

Certain embodiments of the present invention may provide a number of technical advantages. For example, according to one embodiment of the present invention, an approach for processing data in a memory, array is provided that offers enhanced processing speeds. The enhanced processing speed is a result of allowing a read enable that is provided to the memory array to arrive late. When the read enable is inactive, it operates to inhibit data from being communicated from the memory array for a selected clock cycle. Thus, one address may be accessed and read by the memory array but the corresponding data for that address may not be communicated or propagate from the memory array. Instead, the data read during a previous cycle from the memory array will continue to propagate to a processor.

This configuration ensures the accuracy of the data in allowing selected information to be retained and communicated during a designated clock cycle. Thus, selected information may propagate consistently and accurately to a corresponding processor that seeks data from the memory array. This accessing or synchronization protocol further allows multiple components to have access to the memory array without compromising the integrity of the data read from the memory array. Embodiments of the present invention may enjoy some, all, or none of these advantages. Other technical advantages may be readily apparent to one skilled in the art from the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which.

DETAILED DESCRIPTION OF THE INVENTION

Figure 1:
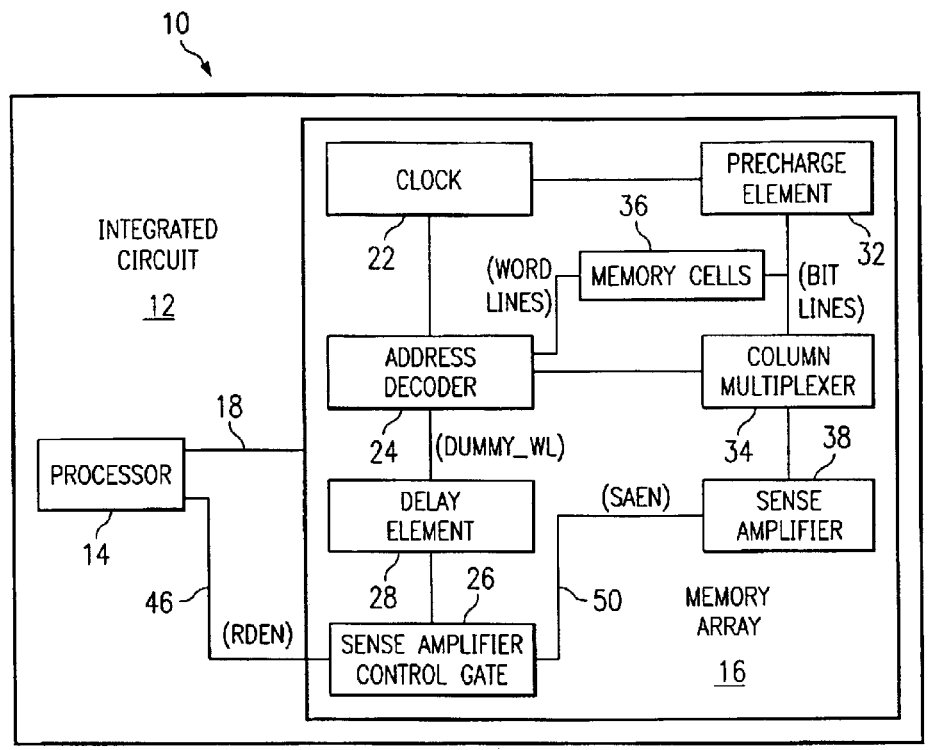
FIG. 1 is a block diagram of a data processing system in accordance with one embodiment of the present invention.

FIG. 1 is a block diagram of a data processing system 10 in accordance with one embodiment of the present invention. Data processing system 10 includes an integrated circuit 12, a processor 14, and a memory array 16 that is coupled to processor 14 via any suitable communications link 18. Memory array 16 includes a clock 22, an address decoder 24, a sense amplifier control gate 26, a delay element 28, a precharge element 32, a column multiplexer 34, a group of memory cells 36, and a sense amplifier 38. Data processing system 10 may be included in any suitable processing environment such as, for example, a digitally integrated circuit chip used to execute one or more tasks in a data processing architecture.

In accordance with the teachings of the present invention, data processing system 10 receives one or more tasks or instructions from processor 14 and processes information in an efficient manner in order to obtain an accurate result that propagates quickly from memory array 16. This is due, in part, to sense amplifier control gate 26 which uses the read enable (RDEN) input to selectively enable or disable the sense amplifier 38 in order to control whether new read data propagates from memory array 16. This allows data from the previous clock cycle to be selectively retained in a subsequent clock cycle. Thus, an access for a next address location in memory array 16 may correspond to the propagation of a data segment from a previously submitted address included in an access request.

In this manner, a next address is automatically sent after retrieving a first data segment from memory array 16. Memory array 16 may then begin to process the second or the next address regardless of whether the second access needs to be blocked. The read enable signal may be used after the read access has started to preclude sense amplifier 38 from allowing data to propagate from memory array 16 to processor 14. If sense amplifier 38 is not triggered or activated in order to allow data to propagate from memory array 16, information included within an accompanying set/reset (S/R) latch does not change and therefore includes the data segment from the previous clock cycle. Accordingly, data segments or information that propagate in response to a subsequent access request from processor 14 can actually reflect information requested in a previous cycle.

This approach for processing data offers enhanced processing speeds as a result of allowing the read enable signal to arrive at the memory array 16 after the clock cycle has started. The read enable signal operates to selectively inhibit data from being communicated from the memory array for a selected clock cycle. This configuration ensures the accuracy of the data in allowing selected information to be retained and communicated during a specific clock cycle. Designated information may propagate consistently and accurately to processor 14 seeking to access data from memory array 16. This accessing or synchronization protocol may additionally allow multiple components to have access to memory array 16 without compromising the integrity of the data read from memory array 16.

Data processing system 10 may be applicable to any data processing configuration that includes conditions that may require some or all of the processing stages to retain a current or designated state. Stalling conditions may be generated at various times in a clock cycle and inhibit system speed by creating a speed limiting path for a corresponding pipeline. For example, certain elements in a pipeline stage of a data processing architecture may calculate a result late in the clock cycle that determines whether other pipeline stages need to be stalled. Such a scenario may be problematic where one or more of the pipeline stages include various segmented memory arrays with the stall condition being distributed to multiple sub-arrays in a corresponding memory element. This additional distribution delay may make a pipeline stage, with memory arrays, significantly more speed limiting than other pipeline stages.

Memory array 16 resolves this issue by providing a data processing platform that can tolerate a stall condition arriving late (after the next clock cycle has begun) and still retain the read data from the previous cycle. This is accomplished through cooperation with delay element 28 and sense amplifier control gate 26 to provide additional time before the read enable signal is valid. This may be particularly beneficial in several applications such as where memory array 16 represents a random access memory (RAM) element. In such a system, an incoming read enable signal may be delivered to memory array 16 late. However, such a late signal may be distributed over several elements, thereby implicating multiple memory banks or sub-arrays. Such a distribution represents extra delays that inhibit the performance of other pipeline stages. Data processing system 10 alleviates this issue by allowing a stall condition for a read access to be delivered after the clock edge (after the next clock cycle has begun) and still be able to keep new data from arriving at the output of memory array 16. Read data is retained from a previous cycle and remains uncorrupted by the operations which seek access to a subsequent address. In this manner, a read enable signal 46 (RDEN) may gate sense amplifier enable signal 50 (SAEN) in sense amplifier control gate 26. Accordingly, where read enable signal 46 is low it blocks a sense amplifier enable signal 50 for sense amplifier 38 and therefore data from the previous cycle continues to propagate from memory array 16 to processor 14.

Processor 14 is a programmable element that includes instruction code for the processing of data or information in data processing system 10. In one embodiment of the present invention, processor 14 is a microprocessor operable to access data included within memory array 16. Alternatively, processor 14 may be a digital signal processor, a microcontroller, a central processing unit, or any other suitable processing element that processes data or information in any communications environment. In an alternative embodiment of the present invention, processor 14 may include memory array 16 and thus represent a single component or piece of hardware to be positioned within integrated circuit 12. Processor 14 may also include any suitable pipeline element or any other suitable hardware or software that facilitates the delivery or transmission of information or data in a data processing environment. In operation, processor 14 requests data or information that is stored within memory array 16. This request may be in response to programmed tasks or instructions provided to processor 14 or data that is communicated by any other suitable element or object. Additionally, processor 14 may be included within or cooperate with any suitable programmable element, such as a field programmable gate array (FPGA), an electrically erasable programmable read-only memory (EEPROM), an erasable programmable read-only memory (EPROM), or any other suitable device, component, element, or object in accordance with particular needs.

Memory array 16 is a segmented RAM element in accordance with one embodiment of the present invention. One or more segmented memory banks represent locations of data storage to be accessed by processor 14 in response to an instruction to be executed. The segmented memory banks may be connected to one or more S/R latches that enable data cells to be properly read from selected memory locations. Based on an incoming address bit or bank enable signal, one segmented memory array bank may not be clocked. Depending on which array bank is enabled, the corresponding memory bank output may also be enabled and operate to update the S/R latch that holds a data segment. The S/R latch may allow the data out memory bank to retain its value while a precharge is occurring that is initiated by precharge element 32. Alternatively, memory array 16 may be any suitable memory element (segmented or unsegmented), such as a dynamic random access memory (DRAM), a fast cycle RAM (FCRAM), a static RAM (SRAM), a read-only memory (ROM), a microcontroller, or any other suitable device, element, or object that operates to store data or information.

Clock 22 is a timing element that provides a synchronization mechanism for one or more elements included within data processing system 10. Clock 22 may also synchronize processor operations such that both memory array 16 and processor 14 execute operations on similar clock cycles. Clock 22 may also be used as a trigger for data or information to be read from memory array 16 or to be placed on corresponding data lines to be used as communication links to processor 14 or to any other suitable destination. Data propagating over data lines may utilize communications link 18 or any other suitable connection or coupling. Communications link 18 may provide a platform that allows information to be read from memory array 16 and communicated to processor 14. This may be controlled by one or more enable signals or triggered by the operation of sense amplifier 38.

Address decoder 24 is a data processing element operable to receive information corresponding to addresses provided by processor 14. Address decoder 24 may receive and process the address portion of an incoming request such that the request is directed to an appropriate location of memory array 16 that stores the requested data. Address decoder 24 may decode a portion of the address in order to generate word lines which control reading data out of memory cells 36 onto bit lines and may also control writing data from bit lines into memory cells 36. Address decoder 24 may also decode another portion of the address in order to provide selection controls for the column multiplexer. The address decoder 24 may also generate a dummy word line for controlling the sense amplifier enable. Address decoder 24 may be synchronized by clock 22 and additionally perform any suitable operations associated with incoming access requests such that requested information is properly directed to processor 14.

Delay element 28 is a circuit element that provides a delay in order to give memory cells 36 sufficient time to drive read data onto bit lines before sense amplifier 38 is enabled. This input of delay element 28 may be a dummy word line or, alternatively, it may be connected directly to a clock signal. The output of delay element 28 may be gated with read enable signal 46 in sense amplifier control gate 26 such that an incoming request for an address does not trigger propagation of data corresponding to the incoming or most recently received address. Precharge element 32 may operate to initialize the bit lines to a predetermined state.

Column multiplexer 34 is an 8:1 multiplexer in accordance with one embodiment of the present invention. Alternatively, column multiplexer 34 may be any suitable type of multiplexer operable to receive and process any number of bit lines. Column multiplexer 34 may cooperate with address decoder 24 in order to properly multiplex information and communicate that information to sense amplifier 38. Sense amplifier 38 may receive one or more data segments from column multiplexer 34 in any suitable format. In operation of an example embodiment, column multiplexer 34 has separate 8:1 multiplexers for reading and writing which receive eight sets of bit lines and invoke address decoder 24 to control the read and write multiplexing. Column multiplexer 34 may be used in part because some memory cells are relatively small compared to sense amplifier 38 and any data output drivers that may be contained in sense amplifier 38. Alternatively, column multiplexer 34 may be any suitable multiplexing element operable to receive multiple inputs and communicate information over a lesser number of outputs.

The elements illustrated in memory array 16 may generally be implemented with hardware, software, or any other suitable components, elements, logic, circuitry, or objects. In addition, memory array 16 may include other elements such as buffers and logic elements used to facilitate a stall effectuated by the coordination of delay element 28 with sense amplifier control gate 26, and sense amplifier 38. Additionally, the elements illustrated as being included within memory array 16 may be arranged, combined, or configured in any suitable manner such that proper timing and stall control is achieved. Data processing system 10 enjoys considerable flexibility in the positioning, elimination, or arrangement of one or more of the elements included within memory array 16.

In operation, a differential sense amplifier enable signal (SAEN) 50 may be generated by gating together a clock signal, a dummy word line delayed by delay element 28, and read enable signal 46 with an AND gate. Where read enable signal 46 is low, sense amplifier 38 is not enabled. Read enable signal 46 may be set up to the rising edge of the delayed dummy word line which may be significantly later than the rising edge of clock 22 that initiates memory read accesses. When sense amplifier 38 is not enabled, it may remain coupled to a set of memory array bit lines.

If a memory cell remains coupled to bit lines for a sufficient period of time, one of the bit lines may go low enough for sense amplifier 38 to sense the read data even though sense amplifier 38 has not been enabled. However, by using a short pulsed read word line protocol (generally implemented in order to save power in certain applications), a corresponding memory cell is only coupled to the bit lines until enough differential between the bit lines is established to reliably sense the read data.

The result of this operation is that generally the bit lines are left high enough such that sense amplifier 38 will not propagate the read data if sense amplifier 38 has not been enabled. By driving read enable signal 46 low, memory array 16 may be successfully stalled and hold the previous read data. The read data may be held in any suitable location such as an S/R latch that is integrated into sense amplifier 38 or connected to an output of sense amplifier 38. In situations where there is a concern that under some conditions the bit lines may move far enough to be sensed, read enable signal 46 may additionally be used to modify protocols associated with precharge element 32 and/or modify controls associated with column multiplexer 34 for added margins of safety or error.

Figure 2A:
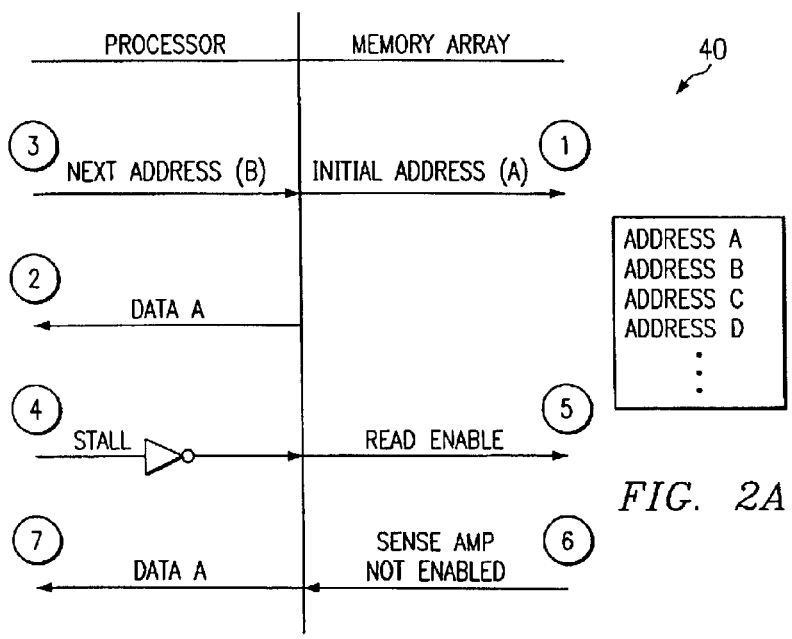
FIG. 2A is a flow diagram illustrating an example implementation for processing data in a memory array.

FIG. 2A is a flow diagram 40 illustrating a series of steps associated with processing data using data processing system 10. At step 1, an initial address is provided by processor 14 and communicated to memory array 16. In the example provided, the initial request is for data corresponding to address 'A.' At step 2, data corresponding to address 'A' may be properly delivered to processor 14 from memory array 16. Alternatively, this step may be delayed until the second request has arrived at memory array 16. At a third step, a next address request is generated by processor 14 and delivered to memory array 16. The next address represents an access request for address 'B' and is properly received by memory array 16. At step 4, a stall is effectuated in data processing system 10 by processor 14 propagating the read enable in an inactive state to memory array 16. The read enable signal is received at sense amplifier control gate 26 at step 5 after a read access has already been initiated within memory array 16. However, at step 6, sense amplifier 38 is not enabled and therefore the data received by processor 14 for this request is data from the previous cycle (i.e. data corresponding to address 'A'). The result of the stall is illustrated at step 7 in flow diagram 40. Additional details relating to this operation are provided below in conjunction with FIG. 2B.

Figure 2B:
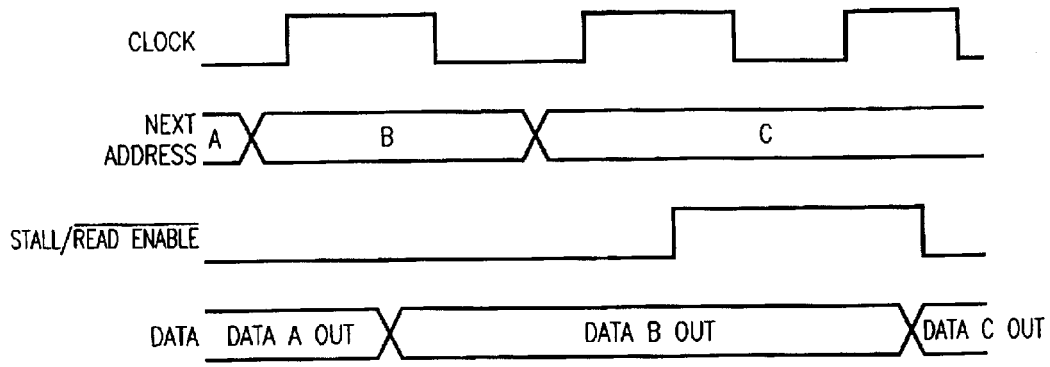
FIG. 2B is a timing schematic corresponding to the flow diagram of FIG. 2A.

FIG. 2B is a timing diagram 60 that illustrates the synchronization of the elements included within memory array 16. Timing diagram 60 includes multiple timing cycles for clock 22. Timing diagram 60 also represents a series of addresses being received by memory array 16 via access requests that are generated by processor 14. Timing diagram 60 also illustrates tasks and instructions that are completed at various stages of the clock cycle.

A first address is generated and communicated by processor 14, the first address corresponding to address 'A.' Then a next address, address 'B,' is generated, communicated, and seen by memory array 16. The stall signal or read enable-bar is then produced. When a stall is not provided, read enable signal 46 is generated in order to allow data to propagate from memory array 16. Data corresponding to address 'B' will be retrieved from memory array 16 and communicated to processor 14. The next address is now already flipped to address 'C' which is what memory array 16 now sees. Then the stall may be implemented, causing the read enable to go to a low value. Thus, although address 'C' is being read, it does not propagate from memory array 16. Instead, during this cycle the data corresponding to address 'B' continues to propagate from memory array 16 to processor 14. Thus, when the stall is removed, the actual data from the address 'C' location propagates from memory array 16. One or more flip-flops may also be provided that receive this data and that are controlled by clock 22.

Accordingly, as illustrated in FIG. 2B, the address of any element within memory array 16 is set up or established before the stall is received. Therefore, the result is data propagation from the previous access of memory array 16. From one perspective, this appears to be the same access or the same address. However, memory array 16 has actually received a new address and memory array 16 has begun the processing of that address but the read access is blocked at sense amplifier control gate 26. Blocking the access at that stage allows read enable signal 46 to be delivered later in the processing cycle.

During one phase of a clock cycle provided by clock 22, a read or write is executed. In another phase of the clock cycle, precharge element 32 executes a precharge on bit lines included within memory array 16. Thus, in a first phase of the clock cycle a word line decoder may be triggering a word line, which may be delayed somewhat from a clock signal that operates to gate a memory cell. The memory cell may then start propagating date onto the bit lines and establish a differential thereto. The bit lines may generally start high and (in a dual-rail configuration) either a bit signal or a bit-bar signal will begin to fluctuate downward. When there is a sufficient differential between the two in sense amplifier 38, an enable is triggered and a full-rail differential is then achieved. From the time the read access begins, communicating information from sense amplifier 38 is precluded until enough differential is established on the bit lines. Thus, there is a significant amount of time from the start of a clock cycle to activating or triggering sense amplifier 38.

The bit lines may be coupled to sense amplifier 38 and, where the only task for a read enable signal is to prohibit sense amplifier 38 from propagating information, it may be delivered late because sense amplifier 38 is only enabled after some time delay. As illustrated in FIG. 2B, this time delay is well into the clock cycle. Dummy word line 48 may be used in some applications to provide, some of this delay, with the remaining delay being delivered by delay element 28. In an example embodiment, 256 word lines may be included in data processing system 10 with one additional word line representing dummy word line 48 that would systematically be active during each read cycle. Dummy word line 48 may then be designed to mimic or share some of the circuitry that is in an actual word line driver. An additional delay may also be added to the first timing delay in order to give the bit lines a sufficient amount of time to establish a differential when dummy word line 48 gets delayed, it may then be fed into an AND gate that combines clock 22 with read enable signal 46 and the delayed dummy word line. Read enable 46 may thus arrive after clock 22 has already gone to a high state because the delayed dummy word line has not gone to a high state.

Generally, read enable signal 46 should be valid by the time the delayed clock/delayed word line goes to a high state. Timing diagram 60 of FIG. 2B illustrates how much later this may be. The clock signal may trigger execution of a read access that then provides some data on the bit lines without the read enable or an address being valid before the rising edge of clock 22. This scenario may operate in conjunction with a pulsed read word line. Pulsed read word lines maintain bit lines from going significantly low because precharging bit lines may represent a significant power consumption.

Figure 3:
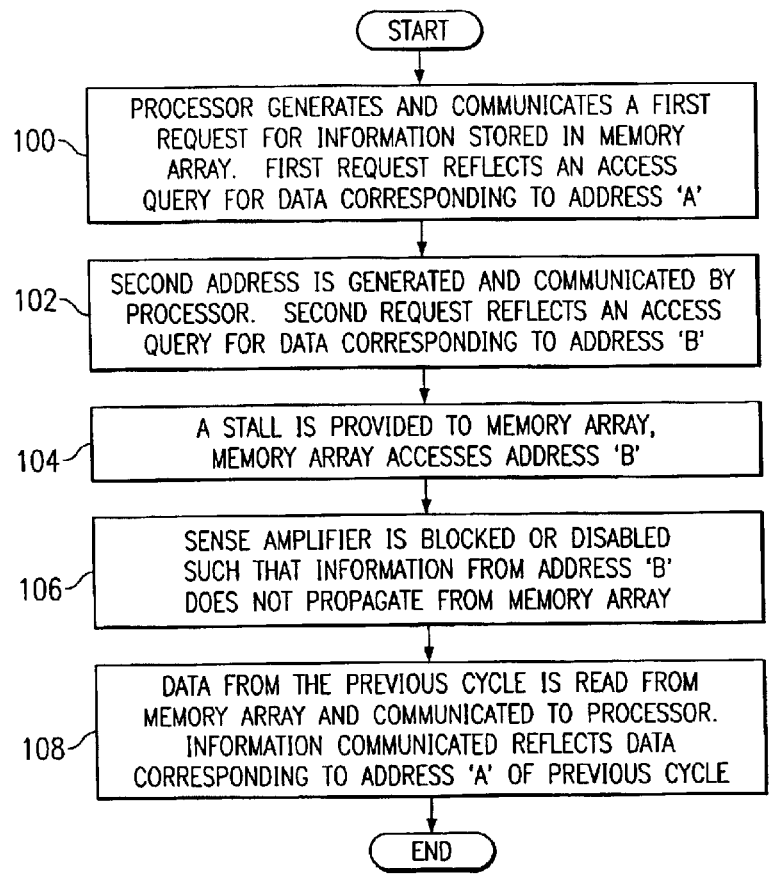
FIG. 3 is a flowchart illustrating a series of example steps associated with a method for processing data.

FIG. 3 is a flowchart illustrating a series of example steps associated with a method of processing data. The method begins at step 100 where processor 14 generates a first request for information stored in memory array 16. The first request reflects an access query for data corresponding to address 'A.' Data corresponding to address 'A' may be delivered by memory array 16 to processor 14. This operation may be delayed, suspended, or deleted such that a second request is received before any subsequent task is executed. At step 102, a second request is generated by processor 14 and properly received by memory array 16. The second request corresponds to a query for a data segment stored at address 'B' included within memory array 16. At step 104, a stall is provided to memory array 16. The memory array 16 is accessing address 'B.' At step 106, sense amplifier 38 is blocked or disabled such that information from address 'B' does not propagate from memory array 16. At step 108, data from the previous cycle is provided by memory array 16 and communicated to processor 14. This data reflects data corresponding to address 'A' of the previous cycle. This routine or protocol may be repeated as data propagates from memory array 16 and is based on a given address from a previous cycle.

Some of the steps illustrated in FIG. 3 may be changed or deleted where appropriate and additional steps may also be added to the flowchart. These changes may be based on specific data processing system architectures or particular communication arrangements or configurations and do not depart from the scope or the teachings of the present invention.

Although the present invention has been described in detail with reference to particular embodiments, it should be understood that various other changes, substitutions, and alterations may be made hereto without departing from the spirit and scope of the present invention. For example, although the present invention has been described with reference to a configuration that includes a single processor 14 and memory array 16, any suitable number of processing and memory components, circuits, elements, or objects may be employed in accordance with the teachings of the present invention. Additionally, numerous segmented or unsegmented memory elements may be included within integrated circuit 12 without departing from the scope of the present invention. The data processing method as described may be applicable to any processing environment or any integrated circuit configuration that seeks to access and to communicate data or information using multiple memory element configurations or processor arrangements.

In addition, although memory array 16 illustrates multiple components operable to effectuate a stall or a blocking of the sense amplifier enable signal, any other suitable elements may be used in order to accomplish this task. For example, additional elements such as amplifiers, inverters, couplers, switches, or programmable elements may be included within integrated circuit 12 or coupled thereto. The embodiment illustrated in FIG. 1 has only been offered for purposes of teaching and example and where appropriate may be inclusive of various other suitable components that facilitate the operations as described herein.

Additionally, it should be appreciated that the elements included within memory array 16 have been coupled in an arbitrary manner for purposes of illustration. Alternatively, these elements may interact in any other suitable fashion in accordance with particular needs. The configuration as illustrated in FIG. 1 has been offered for purposes of example and teaching only and should not be construed to limit the scope of the present invention. Appropriate connections, interfaces, and couplings may be added to FIG. 1 in accordance with the teachings of the present invention.

Moreover, although FIG. 3 illustrates a series of example steps associated with a method for processing data, numerous other steps may be provided thereto without departing from the teachings of the present invention. For example, the stall may be positioned at any suitable time period in order to retain data from a selected clock cycle. Timing diagram 60 and flow diagram 40 have only been offered for purposes of example. In other scenarios, the stall may be positioned at any time interval during a processing cycle provided the stall is asserted long enough to maintain the selected data.

Numerous other changes, substitutions, variations, alterations, and modifications may be ascertained by those skilled in the art and it is intended that the present invention encompass all such changes, substitutions, variations, alterations, and modifications as falling within the spirit and scope of the appended claims. Moreover, the present invention is not intended to be limited in any way by any statement in the specification that is not otherwise reflected in the appended claims.

What is claimed is:

1. An apparatus for processing data in a memory array, comprising:
   a processor operable to generate a plurality of instructions for processing data; and
   a memory array coupled to the processor and operable to store data that may be communicated to the processor, the memory array operable to receive a first request in a first clock cycle from the processor for access to a first data segment corresponding to a first address included in the first request, the memory array operable to respond to the first request by communicating the first data segment to the processor, the memory array being further operable to receive a second request in a second clock cycle for access to a second data segment corresponding to a second address included in the second request, the memory array operable to respond to the second request by allowing the second data segment to be read out of the memory array and onto a bit line, the memory array operable to prevent the second data segment from propagating to the processor during the second clock cycle and to allow the first data segment to be communicated to the processor in response to the second request.

2. The apparatus of claim 1, wherein the memory array includes a sense amplifier operable to enable data to propagate from the memory array to the processor.

3. The apparatus of claim 2, wherein the memory array includes an address decoder operable to receive the first and second requests and to decode the first and second addresses in order to access the first and second data segments.

4. The apparatus of claim 3, wherein the memory array includes a column multiplexer operable to receive a plurality of sets of bit lines and to communicate with the address decoder in order to execute multiplexing such that a resultant is produced and communicated to the sense amplifier.

5. The apparatus of claim 3, wherein the memory array implements pulsed read word lines operable to maintain one or more bit lines included in the memory array at a high signal level, and wherein the pulsed read word lines are initiated in order to establish a differential on one or more of the bit lines such that the sense amplifier is enabled.

6. The apparatus of claim 3, wherein the sense amplifier receives an enable signal gated by a read enable signal such that the first data segment is read from the memory array in response to the second request.

7. The apparatus of claim 1, wherein the memory array is divided into a plurality of memory banks operable to store data to be accessed by the processor, and wherein one or more of the memory banks are coupled to each other via one or more set/reset (S/R) latches that are each operable to communicate with one or more data cells included in the first and second data segments.

8. The apparatus of claim 1, wherein the memory array is a static random access memory element operable to provide information to be communicated to the processor.

9. A method for processing data, comprising:
   receiving a first request from a processor for access to a first data segment corresponding to a first address included in the first request, the first request being received during a first clock cycle;
   receiving a second request for access to a second data segment corresponding to a second address included in the second request, the second request being received during a second clock cycle;
   disabling the second data segment from being communicated to the processor; and
   communicating the first data segment to the processor in response to the second request.

10. The method of claim 9, further comprising:
    enabling a selected one of the first and second data segments to propagate from a memory array to the processor in response to receiving a selected one of the first and second requests.

11. The method of claim 10, further comprising:
    decoding the first and second requests in order to access the first and second data segments corresponding to the first and second addresses respectively.

12. The method of claim 11, further comprising:
    receiving a plurality of sets of bit lines; and
    multiplexing one or more of the bit lines such that a resultant is produced and communicated to a next destination.

13. The method of claim 9, further comprising:
    utilizing pulsed read word lines in order to maintain one or more bit lines at a high signal level; and
    initiating one or more of the pulsed read word lines in order to establish a differential on one or more of the bit lines such that a selected one of the first and second data segments is communicated to the processor.

14. The method of claim 9, further comprising:
    receiving an enable signal gated by a read enable signal such that the first data segment is communicated from a memory array in response to the second request.

15. A system for processing data in a memory array, comprising:
- a processor operable to generate a plurality of instructions for processing data; and
- a memory array coupled to the processor and operable to store data that may be communicated to the processor, the memory array receiving a first request from the processor for access to a first data segment corresponding to a first address included in the first request, the first request being received during a first clock cycle, the memory array being further operable to receive a second request for access to a second data segment corresponding to a second address included in the second request, the second request being received during a second clock cycle, wherein the memory array does not enable the second data segment to propagate from the memory array such that the first data segment is communicated to the processor in response to the second request, the memory array further comprising:
  - a sense amplifier operable to enable a selected one of the first and second data segments to propagate from the memory array to the processor;
  - an address decoder operable to receive the first and second requests and to decode the first and second addresses in order to access the first and second data segments; and
  - a column multiplexer operable to receive a plurality of sets of bit lines and to communicate with the address decoder in order to execute multiplexing such that a resultant is produced and communicated to the sense amplifier.

16. The system of claim 15, wherein the memory array implements pulsed read word lines operable to maintain one or more bit lines included in the memory array at a high signal, and wherein the pulsed read word lines are initiated in order to establish a differential on one or more of the bit lines such that the sense amplifier senses data from the bit lines only when enabled.

17. The system of claim 15, wherein the sense amplifier receives an enable signal gated by a read enable signal such that the first data segment is read from the memory array in response to the second request.

18. A system for processing data, comprising:
- means for receiving a first request from a processor for access to a first data segment corresponding to a first address included in the first request, the first request being received during a first clock cycle;
- means for receiving a second request for access to a second data segment corresponding to a second address included in the second request, the second request being received during a second clock cycle;
- means for disabling the second data segment from being communicated to the processor; and
- means for communicating the first data segment to the processor in response to the second request.

19. The system of claim 18, further comprising:
means for enabling a selected one of the first and second data segments to propagate from a memory array to the processor.

20. The system of claim 19, further comprising:
means for decoding the first and second addresses in order to access the first and second data segments.

21. The system of claim 20, further comprising:
means for receiving one or more sets of bit lines; and
means for multiplexing one or more of the bit lines such that a resultant is produced and communicated to a next destination.

22. The system of claim 18, further comprising:
means for utilizing pulsed read word lines in order to maintain one or more bit lines at a high signal level; and
means for initiating one or more of the pulsed read word lines in order to establish a differential on one or more of the bit lines such that a selected one of the first and second data segments is communicated to the processor.

23. A computer readable medium having code for processing data, the code operable to:
- receive a first request from a processor for access to a first data segment corresponding to a first address included in the first request, the first request being received during a first clock cycle;
- receive a second request for access to a second data segment corresponding to a second address included in the second request, the second request being received during a second clock cycle;
- disable the second data segment from being communicated to the processor; and
- communicate the first data segment to the processor in response to the second request.

24. The code of claim 23, further operable to:
enable the first and second data segments to propagate from a memory array to the processor.

25. The code of claim 24, further operable to:
decode the first and second requests in order to access the first and second data segments corresponding to the first and second addresses respectively.

26. The code of claim 25, further operable to:
receive one or more sets of bit lines; and
multiplex one or more of the bit lines such that a resultant is produced and communicated to a next destination.

27. The code of claim 23, further operable to:
utilize pulsed read word lines in order to maintain one or more bit lines at a high signal level; and
initiate one or more of the pulsed read word lines in order to establish a differential on one or more of the bit lines such that a selected one of the first and second data segments is communicated to the processor.

28. The code of claim 23, further operable to:
receive an enable signal gated by a read enable signal such that the first data segment is communicated in response to the second request.

* * * * *